(12) United States Patent
Du et al.

(10) Patent No.: US 11,367,752 B2
(45) Date of Patent: Jun. 21, 2022

(54) PIXEL LAYOUT STRUCTURE, METAL MASK, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Sen Du, Beijing (CN); Yuanqi Zhang, Beijing (CN); Leifang Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 445 days.

(21) Appl. No.: 16/346,871

(22) PCT Filed: Nov. 26, 2018

(86) PCT No.: PCT/CN2018/117380
§ 371 (c)(1),
(2) Date: May 1, 2019

(87) PCT Pub. No.: WO2019/153841
PCT Pub. Date: Aug. 15, 2019

(65) Prior Publication Data
US 2021/0280644 A1 Sep. 9, 2021

(30) Foreign Application Priority Data
Feb. 9, 2018 (CN) .......................... 201810135783.2

(51) Int. Cl.
*H01L 27/32* (2006.01)
*H01L 51/56* (2006.01)
(Continued)

(52) U.S. Cl.
CPC .......... *H01L 27/3218* (2013.01); *C23C 14/04* (2013.01); *C23C 14/042* (2013.01);
(Continued)

(58) Field of Classification Search
CPC .................... H01L 27/3216; H01L 27/3218
See application file for complete search history.

(56) References Cited

U.S. PATENT DOCUMENTS 6,714,206 B1 * 3/2004 Martin ................. G09G 3/2003
345/589
8,115,216 B2 * 2/2012 Smith ................. G09G 3/3208
257/88
(Continued)

FOREIGN PATENT DOCUMENTS

CN 105529353 A * 4/2016 ............. H01L 27/32
CN 106816449 A * 6/2017 ......... H01L 27/3216
(Continued)

OTHER PUBLICATIONS

Machine translation, Zhang, Chinese Pat. Pub. No. CN 106816449A, translation date: Jul. 20, 2021, Espacenet, all pages. (Year: 2021).*
(Continued)

*Primary Examiner* — Victoria K. Hall
(74) *Attorney, Agent, or Firm* — Syncoda LLC; Feng Ma (57) ABSTRACT

A pixel layout structure includes a plurality of first sub-pixels, a plurality of second sub-pixels, and a plurality of third sub-pixel, which are arranged as a plurality of first repeat units, each including a first sub-pixel and a second sub-pixel, and further as a plurality of second repeat units, each including a third sub-pixel and a second sub-pixel. The first repeat units and the second repeat units are alternately arranged along a first direction and a second direction intersecting with it. The second sub-pixels are arranged in a matrix along the first direction and the second direction.
(Continued)

Every four second sub-pixels surround one first sub-pixel or one third sub-pixel, and the first sub-pixels and the third sub-pixels are alternately arranged in the first direction and the second direction.

7 Claims, 10 Drawing Sheets (51) Int. Cl.
*C23C 14/04* (2006.01)
*C23C 14/12* (2006.01)
*C23C 14/24* (2006.01)

(52) U.S. Cl.
CPC .............. *C23C 14/12* (2013.01); *H01L 27/32* (2013.01); *H01L 27/3216* (2013.01); *H01L 51/56* (2013.01); *C23C 14/24* (2013.01)

(56) References Cited

U.S. PATENT DOCUMENTS

| | | | | |
|---|---|---|---|---|
| 9,697,760 | B2 | 7/2017 | Wang | |
| 10,186,557 | B2* | 1/2019 | Ma | H01L 51/0012 |
| 10,446,618 | B2* | 10/2019 | Wang | H01L 27/3216 |
| 10,909,901 | B2* | 2/2021 | Wu | H01L 27/3216 |
| 11,004,905 | B2* | 5/2021 | Sun | H01L 27/3218 |
| 11,024,221 | B2* | 6/2021 | Zhang | H01L 51/56 |
| 11,145,693 | B2* | 10/2021 | Xiao | H01L 27/3216 |
| 2002/0015110 | A1* | 2/2002 | Brown Elliott | G09G 3/3614 348/589 |
| 2009/0302331 | A1* | 12/2009 | Smith | G09G 3/3208 257/88 |
| 2013/0234917 | A1* | 9/2013 | Lee | H01L 27/3218 345/82 |
| 2014/0071030 | A1* | 3/2014 | Lee | H01L 27/3218 345/82 |
| 2014/0252321 | A1* | 9/2014 | Pyon | H01L 27/3246 257/40 |
| 2014/0319484 | A1* | 10/2014 | Kwon | H01L 27/3216 257/40 |
| 2015/0091785 | A1* | 4/2015 | Lee | H01L 27/3218 345/77 |
| 2015/0132875 | A1* | 5/2015 | Lee | B05C 21/005 438/29 |
| 2015/0200237 | A1* | 7/2015 | Yim | H01L 27/3248 257/40 |
| 2016/0078807 | A1* | 3/2016 | Sun | G09G 3/3233 345/204 |
| 2016/0124557 | A1* | 5/2016 | Choi | G06F 1/1626 345/173 |
| 2016/0240592 | A1* | 8/2016 | Li | H01L 27/3216 |
| 2016/0253943 | A1* | 9/2016 | Wang | H01L 27/3218 345/694 |
| 2016/0276416 | A1* | 9/2016 | Ma | H01L 27/3216 |
| 2016/0342043 | A1* | 11/2016 | Nakanishi | G09G 3/3225 |
| 2017/0039923 | A1* | 2/2017 | Feng | G09G 3/3225 |
| 2017/0278905 | A1* | 9/2017 | Hsu | H01L 27/3216 |
| 2017/0294491 | A1* | 10/2017 | Jo | G09G 3/2003 |
| 2017/0309688 | A1* | 10/2017 | Lee | H01L 27/3216 |
| 2017/0317145 | A1* | 11/2017 | Hong | G06F 3/0446 |
| 2018/0076270 | A1* | 3/2018 | Kwon | H01L 51/0097 |
| 2018/0097043 | A1* | 4/2018 | Song | H01L 27/3246 |
| 2018/0247985 | A1* | 8/2018 | Jeon | H01L 27/156 |
| 2018/0277040 | A1* | 9/2018 | Lee | H01L 27/3276 |
| 2018/0375057 | A1* | 12/2018 | Shin | H01L 51/56 |
| 2019/0006430 | A1* | 1/2019 | Jun | H01L 51/5221 |
| 2019/0035859 | A1* | 1/2019 | Kang | H01L 27/3234 |
| 2019/0074329 | A1* | 3/2019 | Kim | H01L 27/3216 |
| 2019/0081112 | A1* | 3/2019 | Tsukamoto | H01L 51/5218 |
| 2019/0088200 | A1* | 3/2019 | Woo | H01L 51/56 |
| 2019/0131355 | A1* | 5/2019 | Chae | G09G 3/3258 |
| 2019/0165061 | A1* | 5/2019 | Jung | H01L 27/323 |
| 2019/0189706 | A1* | 6/2019 | Choi | H01L 27/3246 |
| 2019/0189723 | A1* | 6/2019 | Kim | H01L 27/1218 |
| 2019/0221780 | A1* | 7/2019 | Ishikawa | H01L 51/5275 |
| 2019/0237524 | A1* | 8/2019 | Chen | H01L 51/5206 |
| 2019/0251318 | A1* | 8/2019 | Jung | H01L 51/5275 |
| 2019/0252469 | A1* | 8/2019 | Xiao | H01L 27/3216 |
| 2019/0355794 | A1* | 11/2019 | Dai | H01L 27/3218 |
| 2019/0363310 | A1* | 11/2019 | Nakamura | H01L 27/3218 |
| 2020/0006445 | A1* | 1/2020 | Hong | H01L 51/5072 |
| 2020/0105843 | A1* | 4/2020 | Baek | H01L 51/5209 |
| 2020/0235173 | A1* | 7/2020 | Nakamura | H01L 27/3216 |
| 2020/0258441 | A1* | 8/2020 | Zhang | G09G 3/2003 |
| 2020/0273924 | A1* | 8/2020 | Xiao | H01L 27/3218 |
| 2020/0343318 | A1* | 10/2020 | Li | H01L 27/3216 |
| 2020/0357325 | A1* | 11/2020 | Zhao | G09G 3/2003 |
| 2020/0357861 | A1* | 11/2020 | Wang | H01L 27/3216 |
| 2020/0357862 | A1* | 11/2020 | Wang | H01L 27/3218 |
| 2021/0098540 | A1* | 4/2021 | Chen | H01L 27/326 |

FOREIGN PATENT DOCUMENTS

| | | | |
|---|---|---|---|
| CN | 106816449 A | 6/2017 | |
| CN | 108364983 A * | 8/2018 | ......... H01L 27/3216 |

OTHER PUBLICATIONS

Machine translation, Zhang, Chinese Pat. Pub. No. CN 105529353A, translation date: Jul. 20, 2021, Espacenet, all pages. (Year: 2021).*
Machine translation, Li, Chinese Pat. Pub. No. CN 108364983A, translation date: Jul. 23, 2021, Espacenet, all pages. (Year: 2021).*
Machine translation, Zhang, Chinese Pat. Pub. No. CN 10681449A, translation date: Jul. 20, 201, Espacenet, all pages. (Year: 2021).*
Machine translation, Li, Chinese Pat. Pub. No. CN 108364983A, translation date: Jul. 23, 201, Espacenet, all pages. (Year: 2021).*
International Search Report in Application No. PCT/CN2018/117380, dated Feb. 25, 2019.

* cited by examiner

PIXEL LAYOUT STRUCTURE, METAL MASK, AND DISPLAY APPARATUS

CROSS-REFERENCE TO RELATED APPLICATION

The present application claims priority to PCT/CN2018/117380 filed Nov. 26, 2018, which also claims priority to Chinese Patent Application No. 201810135783.2 filed on Feb. 9, 2018, the disclosures of which are hereby incorporated by reference in their entirety.

TECHNICAL FIELD

The present disclosure relates generally to the field of display technologies, and more specifically to a pixel layout structure, a high-precision metal mask, and a display apparatus.

BACKGROUND

The organic light emitting diode (OLED) display technology is one of the hot areas for research and development in the field of flat panel display technologies. Compared with a conventional liquid crystal display (LCD) device, an OLED display device has advantages such as low energy consumption, low production cost, self-luminescence, wide viewing angles, and fast response speed. At present, OLED display devices have begun to replace traditional LCD display panels in mobile phones, PDAs, digital cameras and other flat display fields.

A typical OLED display device includes a substrate, and a plurality of sub-pixels arranged in a matrix over the substrate. Each of the plurality of sub-pixels is generally an organic electroluminescent structure formed at each position of an array substrate corresponding to each of the plurality of sub-pixel through an evaporation filming of an organic material by means of a high-precision metal mask.

The sizes of the plurality of sub-pixels are directly determined by the opening sizes of the high-precision metal mask. Because of the current technical limitation in preparing a high-precision metal mask, it is typically difficult to reach a satisfactory high-resolution display with the pixel structure obtained by existing high-precision metal masks.

SUMMARY

In a first aspect, the present disclosure provides a pixel layout structure.

The pixel layout structure includes a plurality of first sub-pixels, a plurality of second sub-pixels, and a plurality of third sub-pixel, which are arranged as a plurality of first repeat units, each comprising a first sub-pixel and a second sub-pixel, and further as a plurality of second repeat units, each comprising a third sub-pixel and a second sub-pixel.

The plurality of first repeat units and the plurality of second repeat units are alternately arranged along a first direction and a second direction intersecting with the first direction, and the plurality of second sub-pixels are arranged in a matrix along the first direction and the second direction. Every four second sub-pixels surround one first sub-pixel or one third sub-pixel, and the plurality of first sub-pixels and the plurality of third sub-pixels are alternately arranged in the first direction and the second direction.

According to some embodiments of the pixel layout structure, at least a portion of a side of at least one of the every four second sub-pixels surrounding the one first sub-pixel or the one third sub-pixel facing the one first sub-pixel or the one third sub-pixel is a curved shape.

According to some other embodiments of the pixel layout structure, a side of at least one of the every four second sub-pixels surrounding the one first sub-pixel or the one third sub-pixel facing the one first sub-pixel or the one third sub-pixel is substantially a straight shape.

In the pixel layout structure disclosed herein, each of the plurality of first sub-pixels can optionally comprise at least four sides facing the every four second sub-pixels.

Further optionally, at least a portion of at least one of the at least four sides is a curved shape.

Herein, the curved shape portion of one first sub-pixel can be substantially parallel to the curved shape portion of one second sub-pixel facing the one first sub-pixel.

The curved shape portion of one first sub-pixel can be substantially same as the curved shape portion of one second sub-pixel facing the one first sub-pixel.

In the pixel layout structure disclosed herein, each of the plurality of third sub-pixels can optionally comprise at least four sides facing the every four second sub-pixels.

Further optionally, at least a portion of at least one of the at least four sides is a curved shape.

Herein, the curved shape portion of one third sub-pixel can be substantially parallel to the curved shape portion of one second sub-pixel facing the one first sub-pixel.

The curved shape portion of one third sub-pixel can be substantially same as the curved shape portion of one second sub-pixel facing the one first sub-pixel.

According to some embodiments of pixel layout structure, both of each of the plurality of first sub-pixels and third sub-pixels comprise at least four sides facing the every four second sub-pixels, and at least a portion of at least one of the at least four sides is a curved shape. It is further configured such that the curved shape portion of one first sub-pixel and one third sub-pixel is substantially parallel to the curved shape portion of one second sub-pixel facing the one first sub-pixel or the one third sub-pixel.

In any one of the embodiments of the pixel layout structure described above, each of the plurality of second sub-pixels can have an axial symmetry shape.

In any one of the embodiments of the pixel layout structure described above, at least one of each of the plurality of first sub-pixels or each of the plurality of third sub-pixels can have a shape of axial symmetry.

In any one of the embodiments of the pixel layout structure described above, each of the plurality of second sub-pixels can have a shape of substantially a circle or an oval, and either or both of each of the plurality of first sub-pixels and each of the plurality of third sub-pixels can have a shape of an irregular octagon with four substantially straight sides and four substantially curved sides by chamfered corners.

According to some embodiments of the pixel layout structure, each of the plurality of second sub-pixels has a relatively smaller size than each of the plurality of first sub-pixels, and each of the plurality of second sub-pixels has a relatively smaller size than each of the plurality of third sub-pixels.

Herein, optionally, each of the plurality of second sub-pixels is configured to emit a green light.

In the pixel layout structure, a gap distance between any adjacent sub-pixels can have a minimum distance of around 16 μm.

In a second aspect, the present disclosure further provides a mask set, which is designed for fabricating a pixel layout structure according to any one of the embodiments as described above.

The mask set can comprise at least one mask, and each of the at least one mask is provided with a plurality of openings, which correspond to the plurality of first sub-pixels, the plurality of second sub-pixels, or the plurality of third sub-pixels of the pixel layout structure in sizes and positions.

According to some embodiments, the mask set comprises a first mask, a second mask, and a third mask. The first mask is provided with a plurality of first openings, corresponding to the plurality of first sub-pixels in sizes and positions; the second mask is provided with a plurality of second openings, corresponding to the plurality of second sub-pixels in sizes and positions; and the third mask is provided with a plurality of third openings, corresponding to the plurality of third sub-pixels in sizes and positions.

In a third aspect, the present disclosure further provides a display apparatus, which comprises a pixel layout structure according to any one of the embodiments as described above.

According to some embodiments of the display apparatus, each of the plurality of first sub-pixels, the plurality of second sub-pixels, and the plurality of third sub-pixels comprises an OLED.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way.

It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

It is noted that the shapes and sizes of various components in the drawings do not reflect their respective true proportions. They serve for illustrating purposes only.

In a first aspect, the present disclosure provides a pixel layout structure.

The pixel layout structure includes a plurality of first sub-pixels, a plurality of second sub-pixels, and a plurality of third sub-pixel, which are arranged as a plurality of first repeat units, each comprising a first sub-pixel and a second sub-pixel, and further as a plurality of second repeat units, each comprising a third sub-pixel and a second sub-pixel.

The plurality of first repeat units and the plurality of second repeat units are alternately arranged along a first direction and a second direction intersecting with the first direction, and the plurality of second sub-pixels are arranged in a matrix along the first direction and the second direction. Every four second sub-pixels surround one first sub-pixel or one third sub-pixel, and the plurality of first sub-pixels and the plurality of third sub-pixels are alternately arranged in the first direction and the second direction.

Figure 1:
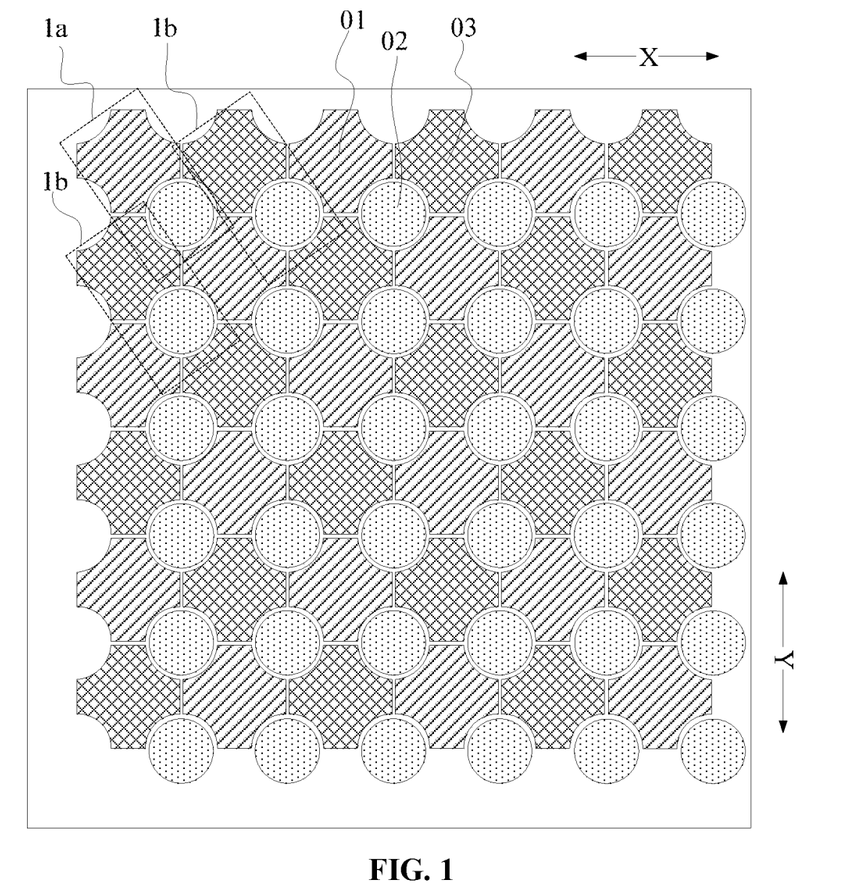
FIG. 1 is a structural diagram of a pixel layout structure according to some embodiments of the present disclosure.
Figure 3:
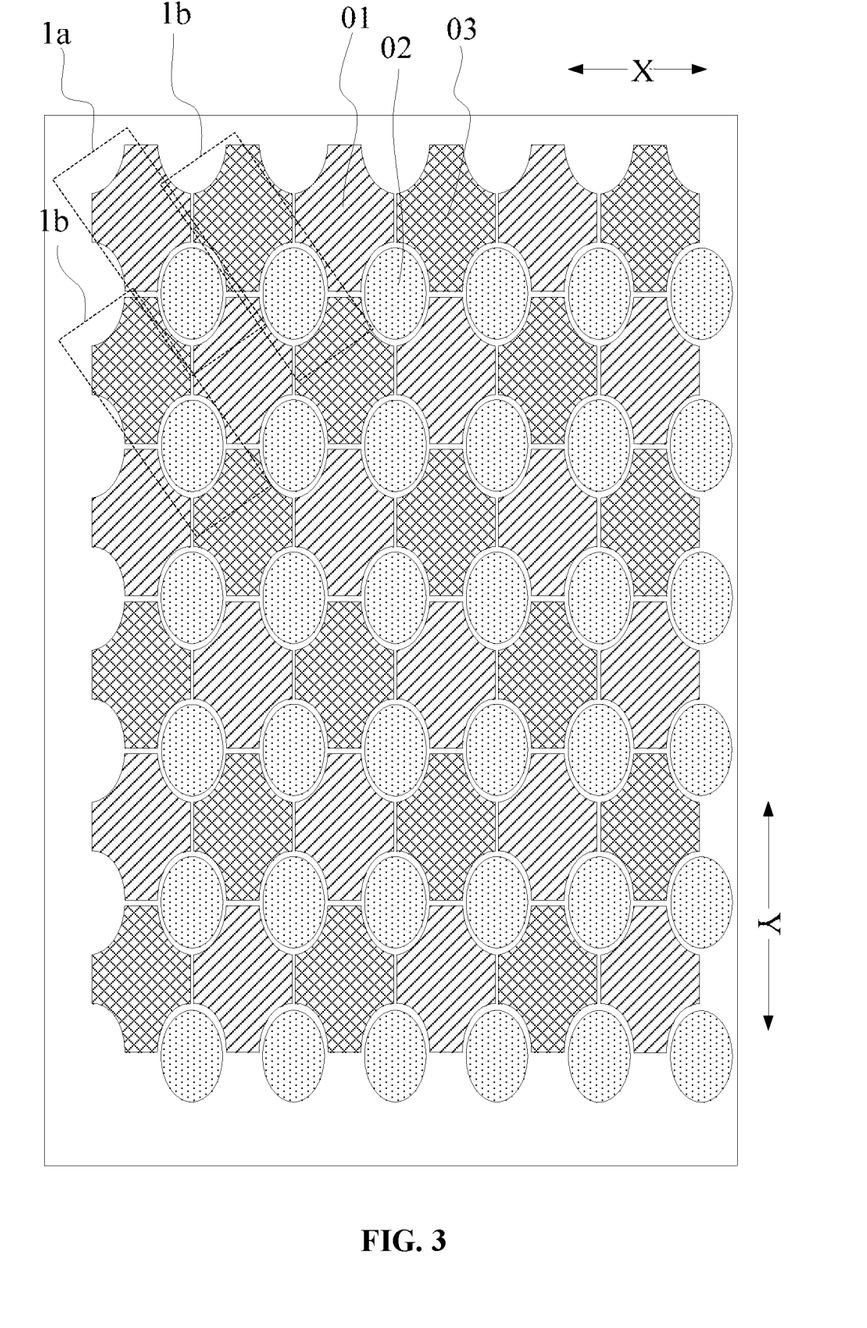
FIG. 3 is a structural diagram of a pixel layout structure according to some other embodiments of the present disclosure.
Figure 5:
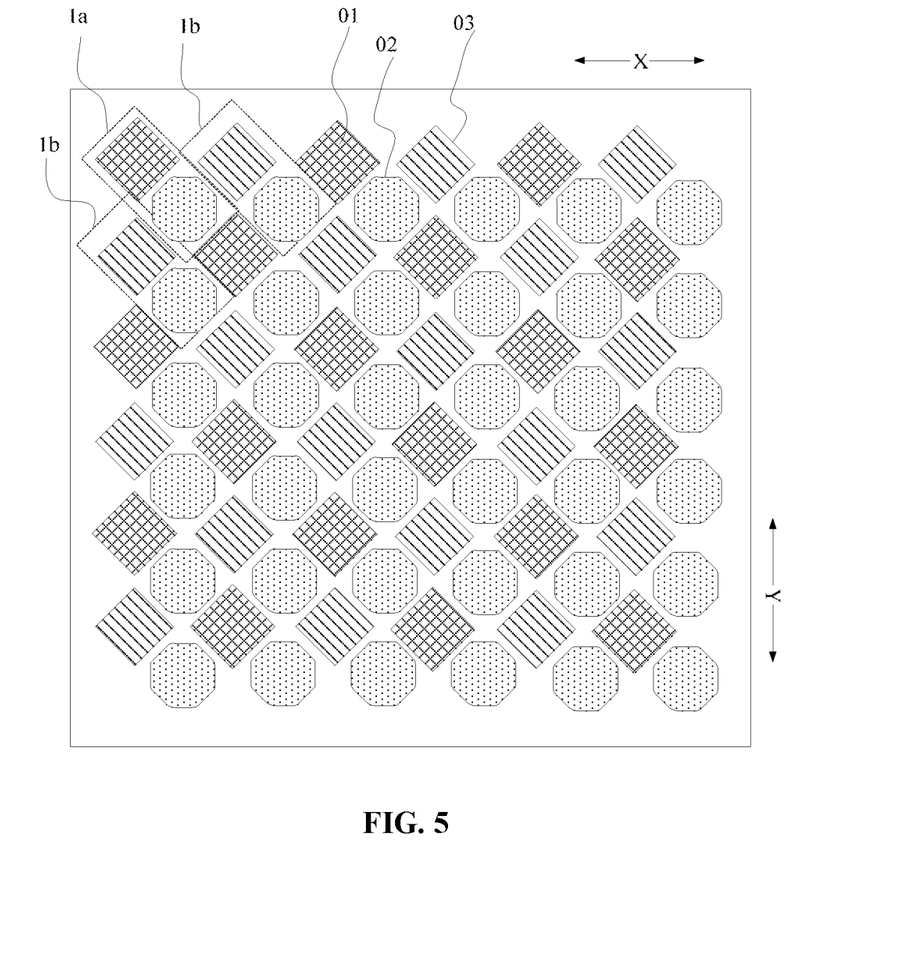
FIG. 5 is a structural diagram of a pixel layout structure according to yet some other embodiments of the present disclosure.

FIGS. 1, 3, and 5 together illustrate a pixel layout structure according to several embodiments of the present disclosure. As shown in the figures, the pixel layout structure includes a plurality of first sub-pixels 01, a plurality of second sub-pixels 02, and a plurality of third sub-pixel 03, which are arranged in a plurality of first repeat units 1a and a plurality of second repeat units 1b.

In some embodiments, the plurality of first repeat units 1a and the plurality of second repeat units 1b are alternately arranged along a first direction and a second direction intersecting with the first direction. In some embodiments, as shown in FIG. 1, the plurality of first repeat units 1a and the plurality of second repeat units 1b are alternately arranged along a direction of each row labeled as X and along a direction of each column labeled as Y.

Each of the plurality of first repeat units 1a includes at least a first sub-pixel 01 and a second sub-pixel 02. In some embodiments, as shown in FIG. 1, each of the plurality of first repeat units 1a includes a first sub-pixel 01 and a second sub-pixel 02.

Each of the plurality of second repeat units 1b includes at least a third sub-pixel 03 and a second sub-pixel 02. In some embodiments, as shown in FIG. 1, each of the plurality of second repeat units 1b includes a third sub-pixel 03 and a second sub-pixel 02.

In some embodiments, the plurality of second sub-pixels 02 are arranged in a matrix having rows and columns. Every four second sub-pixels 02 surround one first sub-pixel 01 or one third sub-pixel 03. Each second sub-pixel 02 is further configured to have a shape of axial symmetry.

Optionally, in the embodiment of the pixel layout structure as illustrated in FIG. 1, the plurality of second sub-pixels 02 are evenly arranged in a matrix, and every four second sub-pixels 02 are configured to surround one first sub-pixel 01 or one third sub-pixel 03. It is further configured such that any pair of a first sub-pixel 01 and a third sub-pixel 03 adjacent to each other along a row direction are arranged to be adjacent to a second sub-pixel 02 along a column direction, and that any pair of a first sub-pixel 01 and a third sub-pixel 03 adjacent to each other along a column direction are arranged to be adjacent to a second sub-pixel 02 along a row direction.

As such, when displaying, any pair of a first sub-pixel 01 and a third sub-pixel 03 adjacent to each other and a second sub-pixel 02 that is adjacent thereto can together form a pixel for illumination. Within each pixel formed thereby, because of a color borrowing principle, the sub-pixels included therein can realize a high-resolution display from a low-resolution physical resolution.

In addition, because each second sub-pixels 02 has a shape of axial symmetry, and the plurality of second sub-pixels 02 are evenly arranged in a matrix, the opening regions of a high-precision metal mask corresponding thereto can be uniformly distributed, resulting in a uniform stress distribution during the process of evaporation deposition, leading to a reduced difficulty in the evaporation deposition process.

Compared with existing pixel layout structure, the pixel layout structure disclosed herein can realize a relatively closer arrangement of the plurality of first sub-pixels 01, the plurality of second sub-pixels 02 and the plurality of third sub-pixels 03 under even a same fabrication condition as the existing technologies. As such, it can be ensured that, with a minimum distance between sub-pixels, the area of each individual sub-pixel can be increased. In turn, the driving current of the display apparatus having this pixel layout structure can be reduced, and the life of the display apparatus can also be extended.

Herein, the above configuration where the plurality of second sub-pixels 02 are arranged evenly in a matrix and every four second sub-pixels 02 surround one first sub-pixel 01 or one third sub-pixel 03 is primarily for the configuration of pixels at a center area of a display panel. The configuration of pixels at an edge area of the display panel can be a little different. For example, first sub-pixels 01 and third sub-pixel 03 may be alternately arranged and not surrounded by second sub-pixels 02 at the edge area of the display panel.

Optionally, at least one of the plurality of second sub-pixels 02 can have a shape of a circle, an oval, a regular polygon, or a regular polygon with chamfered corners, etc. Optionally, each of the plurality of second sub-pixels 02 can have a shape of a circle, an oval, a regular polygon, or a regular polygon with chamfered corners, etc., according to different embodiments of the pixel layout structure illustrated in FIGS. 1, 3 and 5. There are no limitations herein.

Due to the current technical limitations of the evaporation deposition process, the larger the interior angles of a sub-pixel, the easier the evaporation deposition process for fabricating the sub-pixel. In situations where a sub-pixel has relatively small interior angles, because the stress is relatively easy to concentrate in there, it is relatively difficult to fabricate an organic material within a relatively small angle, so it is typically necessary to compensate for the pattern of the mask.

As such, each of the plurality of second sub-pixels 02 can be configured to have relatively large interior angles, such that the pattern complexity of the mask can be reduced, which in turn can reduce the difficulty of the evaporation deposition process whereby the plurality of second sub-pixels 02 are formed or fabricated.

The pixel layout structure can be configured such that a shape of each of the plurality of second sub-pixels 02 can be a regular polygon. The greater the number of sides of a regular polygon, the closer its shape to a circle, the easier the evaporation deposition process. In some embodiments, each corner of the regular polygon can be configured to have a chamfered angle, to further reduce the difficulty of the evaporation deposition process, which can in turn lead to an increased opening ratio for the pixels.

In order to reduce a pattern complexity of the mask for evaporation deposition and to improve the uniformity of the stress distribution during the evaporation deposition process, each of the plurality of first sub-pixels 01 can be configured to have a shape of axial symmetry in the pixel layout structure, as illustrated in FIGS. 1, 3 and 5. It is noted that each of the plurality of first sub-pixels 01 can also be configured to have other regular or irregular shapes. There are no limitations herein.

According to some embodiments of the pixel layout structure, each of the plurality of second sub-pixels 02 has a shape of a circle or an oval, as respectively illustrated in FIG. 1 and FIG. 3, and each of the plurality of first sub-pixels 01 can have a shape of an irregular octagon, where each side of the irregular octagon facing a second sub-pixel 02 can have a shape of an inward curve (i.e. a concave shape).

As such, in these embodiments of the pixel layout structure, the difficulty for fabricating the plurality of first sub-pixels 01 via an evaporation deposition process can be reduced. In addition, gaps between each pair of adjacent first sub-pixel 01 and second sub-pixel 02 can be ensured to have uniform gap distances, so that the opening ratio for pixels can be maximally increased while the issue of color mixing can still be avoided.

Optionally, each side of the irregular octagon for a first sub-pixel 01 facing a third sub-pixel 03 adjacent to it can be further configured to be a straight line, as illustrated in both FIG. 1 and FIG. 3. As such, the pattern complexity of the high-precision metal mask used for pixel fabrication can be reduced, and the concentration of stress can also be decreased, thereby leading to a reduced difficulty of the evaporation deposition process.

Optionally, in order to ensure a substantially equal gap distance between a first sub-pixel 01 and each of the second sub-pixels 02 adjacent to it to thereby reduce a distance therebetween, a side of the first sub-pixel 01 can be configured to be substantially parallel to a side of an adjacent second sub-pixels 02 facing to the side of the first sub-pixel 01, as illustrated in FIGS. 1 and 3. It is noted that a side of the first sub-pixel 01 can be non-parallel to a side of an adjacent second sub-pixels 02 facing thereto according to some other embodiments of the disclosure, and there are no limitations herein.

According to some embodiments of the pixel layout structure, each of the plurality of second sub-pixels 02 has a shape of a circle or an oval, as respectively illustrated in FIG. 1 and FIG. 3, and each of the plurality of third sub-pixels 03 can have a shape of an irregular octagon, where each side of the irregular octagon facing a second sub-pixel 02 can have a shape of an inward curve (i.e. a concave shape).

As such, in these embodiments of the pixel layout structure, the difficulty for fabricating the plurality of third sub-pixels 03 via an evaporation deposition process can be reduced. In addition, gaps between each pair of adjacent third sub-pixel 03 and second sub-pixel 02 can be ensured to have uniform gap distances, so that the opening ratio for pixels can be maximally increased while the issue of color mixing can still be avoided.

Optionally, each side of the irregular octagon for a third sub-pixel 03 facing a first sub-pixel 01 adjacent to it can be further configured to be a straight line, as illustrated in both FIG. 1 and FIG. 3. As such, the pattern complexity of the high-precision metal mask used for pixel fabrication can be reduced, and the concentration of stress can also be decreased, thereby leading to a reduced difficulty of the evaporation deposition process.

Optionally, in order to ensure a substantially equal gap distance between a third sub-pixel 03 and each of the second sub-pixels 02 adjacent to it to thereby reduce a distance therebetween, a side of the third sub-pixel 03 can be configured to be substantially parallel to a side of an adjacent second sub-pixels 02 facing to the side of the third sub-pixel 03, as illustrated in FIGS. 1 and 3. It is noted that a side of the third sub-pixel 03 can be non-parallel to a side of an adjacent second sub-pixels 02 facing thereto, and there are no limitations herein.

According to some embodiments of the pixel layout structure, as illustrated in FIG. 1 and FIG. 3, each of the plurality of first sub-pixels 01 and each of the plurality of third sub-pixels 03 are configured to have a substantially same shape. As such, the plurality of first sub-pixels 01 the plurality of second sub-pixels 02, and the plurality of third sub-pixels 03 can be arranged closely. It is noted that a shape of each of the plurality of first sub-pixel 01 can be different from a shape of each of the plurality of third sub-pixel 03 according to some other embodiments of the disclosure. There are no limitations herein.

Optionally, in order to ensure a substantially equal gap distance between a third sub-pixel 03 and a first sub-pixel 01 adjacent to it to thereby reduce a distance therebetween, a side of the third sub-pixel 03 can be configured to be substantially parallel to a side of an adjacent first sub-pixel 02 facing to the side of the third sub-pixel 03, as illustrated in FIGS. 1 and 3. It is noted that a side of the third sub-pixel 03 can be non-parallel to a side of an adjacent second sub-pixels 02 facing thereto according to some other embodiments of the disclosure, and there are no limitations herein.

It is noted that the specific shapes, sizes, and relative positions for the plurality of first sub-pixels 01, the plurality of second sub-pixels 02, and plurality of third sub-pixels 03 can be designed based on practical needs.

Herein, optionally, a minimum distance between any two adjacent sub-pixels can be substantially equal to, or more than, a minimum distance for a manufacturing process, which depends on the different manufacturing process of the mask.

For example, if a high-resolution metal mask is employed in combination with an etching process to form the pattern for pixels, the minimum distance for such a manufacturing process can be around 16 μm. If a different manufacturing process, such as a laser-based approach, is employed, the minimum distance therefor can be smaller, such as smaller than 16μm.

According to some embodiments of the pixel layout structure, each of the plurality of second sub-pixels 02 can be a green-colored sub-pixel (G, i.e. a green light-emitting sub-pixel), each of the plurality of first sub-pixels 01 can be a red-colored sub-pixel (R, i.e. a red light-emitting sub-pixel), and each of the plurality of third sub-pixels 03 can be a blue-colored sub-pixel (B, i.e. a blue light-emitting sub-pixel).

Alternatively, according to some other embodiments of the pixel layout structure, each of the plurality of second sub-pixels 02 can still be a green-colored sub-pixel (G, i.e. a green light-emitting sub-pixel), each of the plurality of first sub-pixels 01 can be a blue-colored sub-pixel (B, i.e. a blue light-emitting sub-pixel), and each of the plurality of third sub-pixels 03 can be a red-colored sub-pixel (R, i.e. a red light-emitting sub-pixel).

Figure 6:
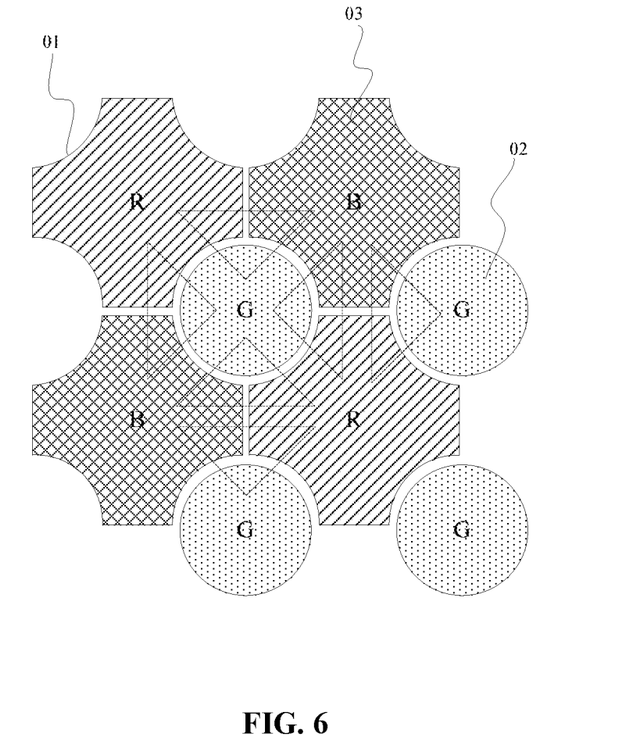
FIG. 6 illustrates a color borrowing among sub-pixels in the pixel layout structure according to some embodiments of the present disclosure.

In either the embodiments described above, a green sub-pixel G can form a pixel along with an adjacent red sub-pixel R and an adjacent blue sub-pixel B, as illustrated by the three sub-pixels encircled by the triangle with dotted lines in FIG. 6. As such, by means of a color borrowing principle, the sub-pixels included therein can realize a high-resolution display from a low-resolution physical resolution.

According to existing display technologies, a green sub-pixel G has a relatively higher light emission efficiency than a blue sub-pixel B or a red sub-pixel R. As such, as illustrated in FIG. 6, it can be configured such that a size (i.e. area) of each of the plurality of second sub-pixels 02 is smaller than a size (i.e. area) of each of the plurality of first sub-pixels 01 and is further smaller than a size (i.e. area) of each of the plurality of third sub-pixels 02. In other words, it is configured such that a green sub-pixel G has a smaller size than a red sub-pixel R or a blue sub-pixel B.

In a second aspect, the present disclosure further provides a set of high-resolution metal masks, which can be employed for the fabrication/manufacturing of the pixel layout structure described and illustrated above.

The schematic diagrams of the structure of each of the set of the high-resolution metal mask is illustrated in FIGS. 2A-2C and 4A-4C.

As shown in the above figures, the set of the high-resolution metal mask can include three metal masks: a first metal mask, a second metal mask, and a third metal mask, which are respectively provided with a plurality of first openings 011, a plurality of second openings 021, and a plurality of third openings 031.

Figure 2A:
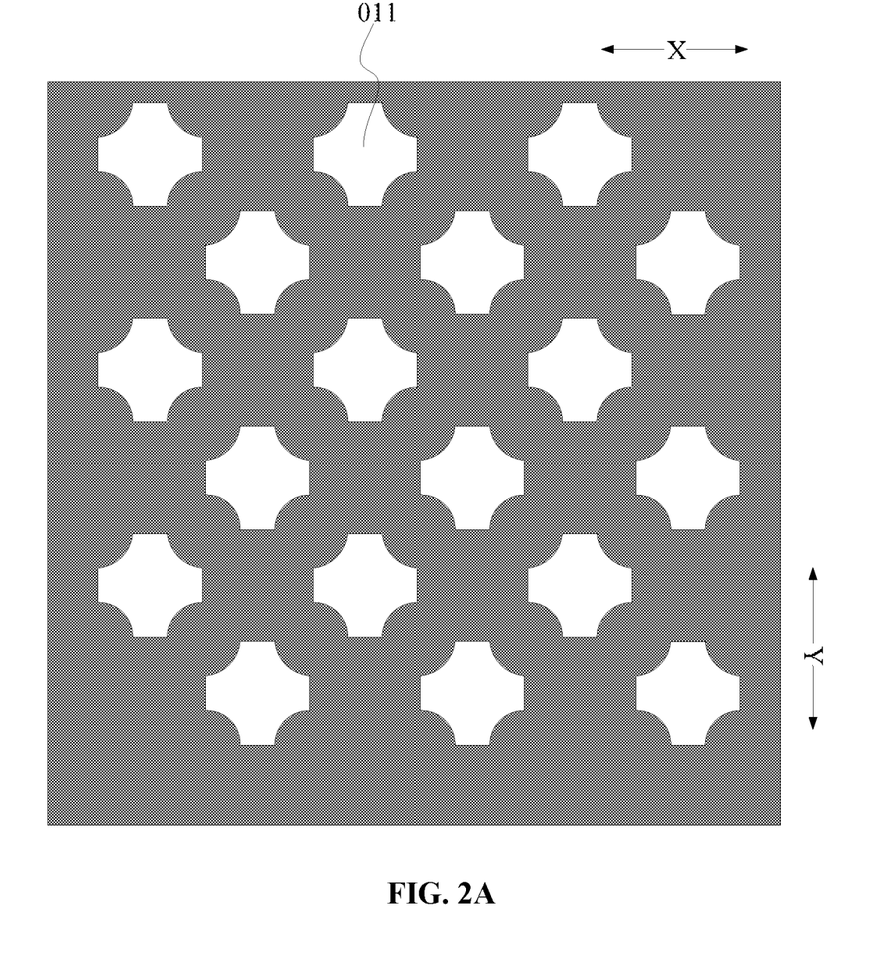
FIG. 2A illustrates a schematic diagram of a structure of the first metal mask for fabricating the plurality of first sub-pixels of the pixel layout structure shown in FIG. 1.
Figure 4A:
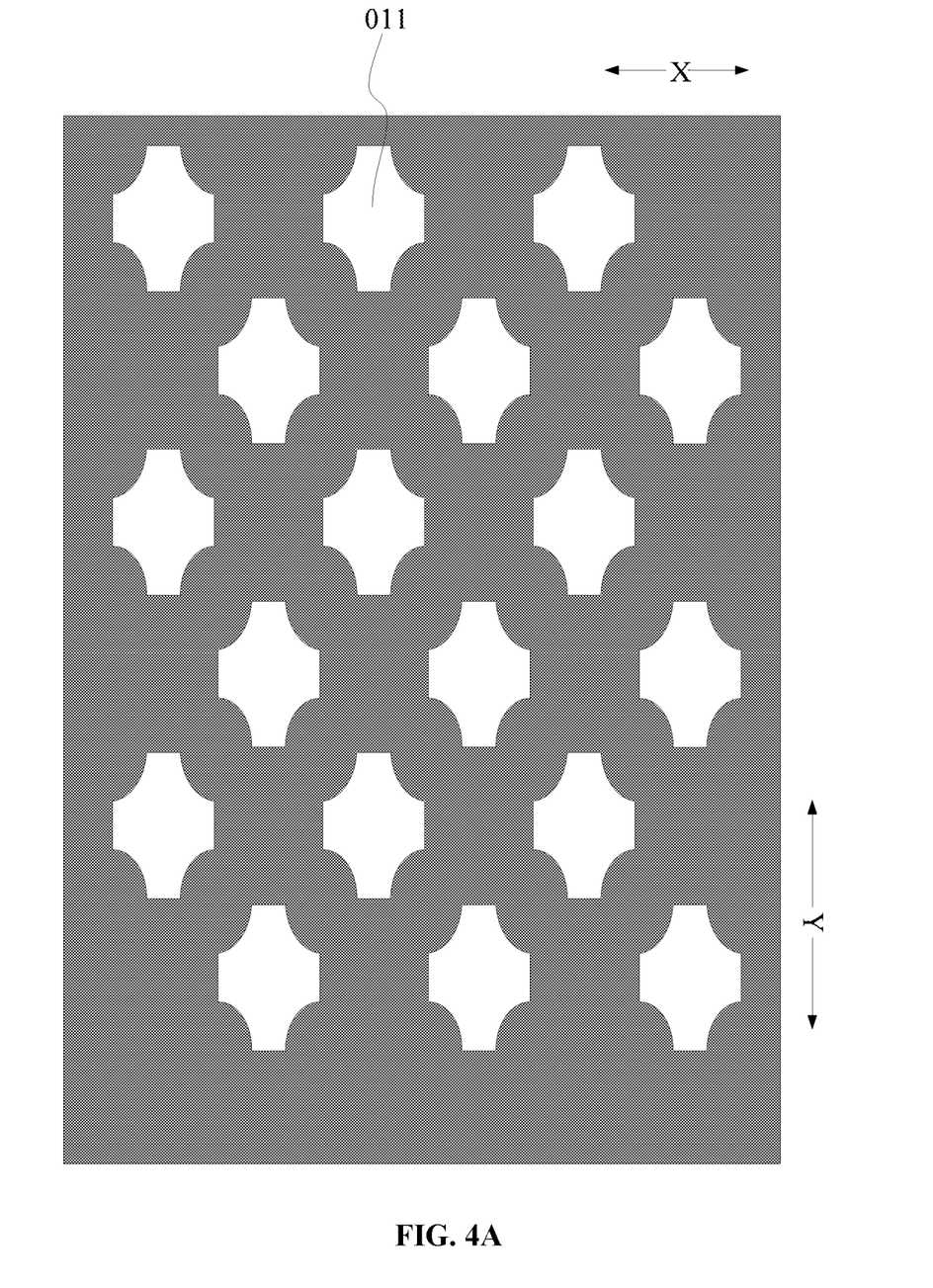
FIG. 4A illustrates a schematic diagram of a structure of the first metal mask for fabricating the plurality of first sub-pixels of the pixel layout structure shown in FIG. 3.

In the first metal mask shown in FIGS. 2A and 4A, the plurality of first openings 011 correspond to the plurality of first sub-pixels 01 in shapes and positions. In the second metal mask shown in FIGS. 2B and 4B, the plurality of second openings 021 correspond to the plurality of second sub-pixels 02 in shapes and positions. In the third metal mask shown in FIGS. 2C and 4C, the plurality of third openings 031 correspond to the plurality of third sub-pixels 03 in shapes and positions.

Figure 2B:
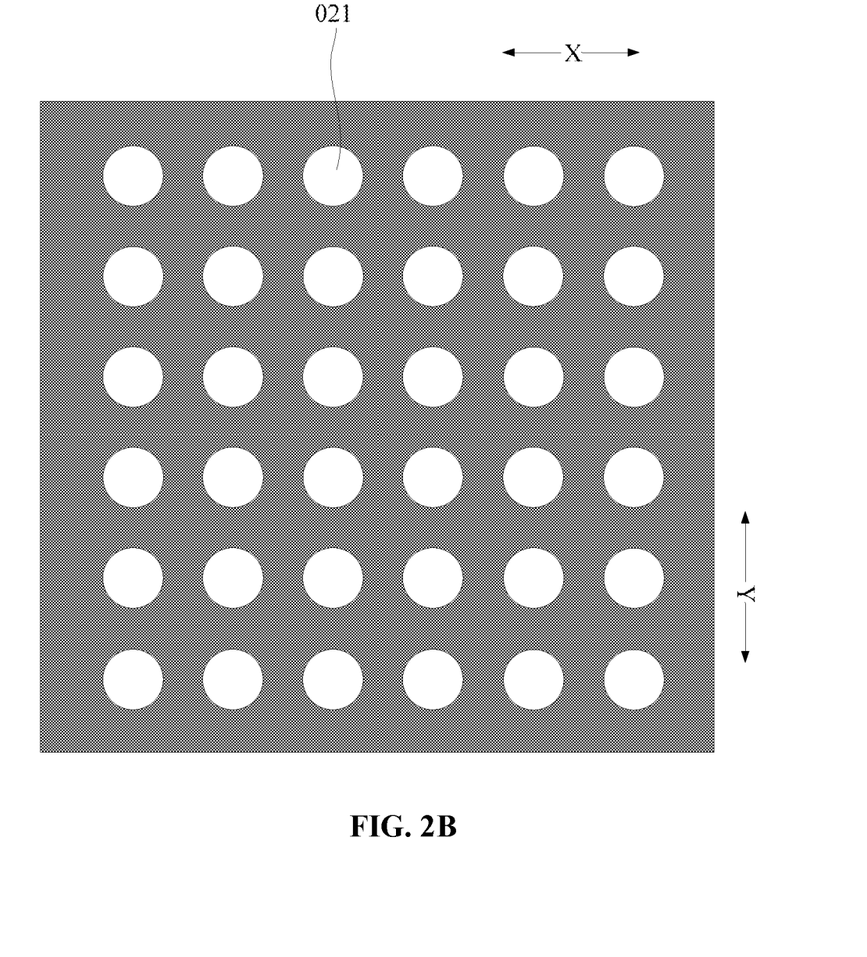
FIG. 2B illustrates a schematic diagram of a structure of the second metal mask for fabricating the plurality of second sub-pixels of the pixel layout structure shown in FIG. 1.
Figure 2C:
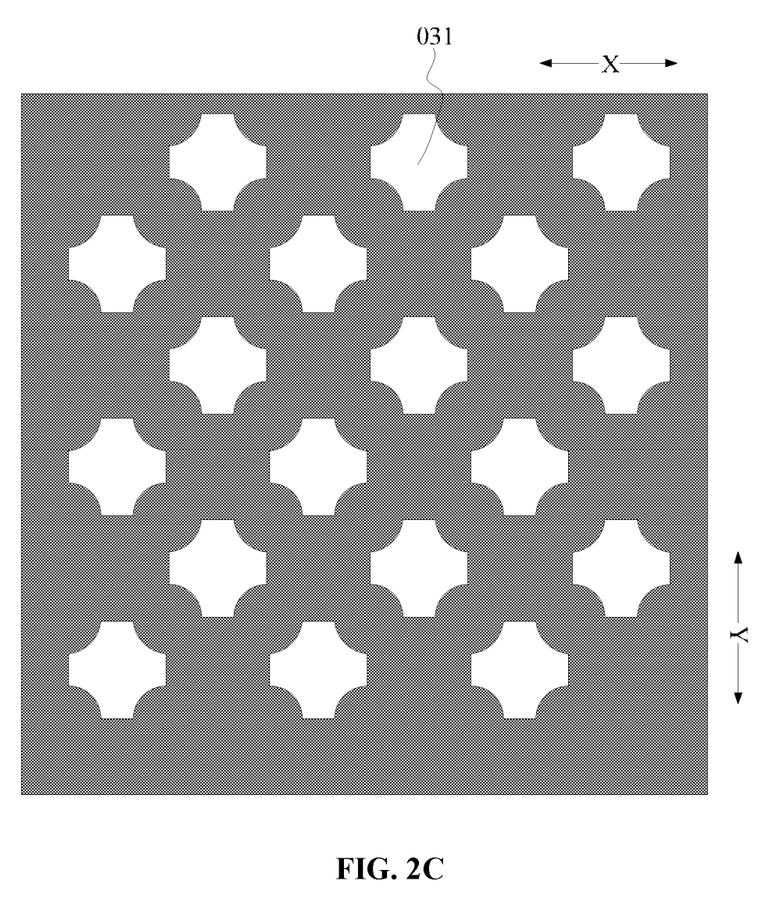
FIG. 2C illustrates a schematic diagram of a structure of the third metal mask for fabricating the plurality of third sub-pixels of the pixel layout structure shown in FIG. 1.

FIG. 2A illustrates a schematic diagram of a structure of the first metal mask for fabricating the plurality of first sub-pixels 01 of the pixel layout structure shown in FIG. 1. FIG. 2B illustrates a schematic diagram of a structure of the second metal mask for fabricating the plurality of second sub-pixels 02 of the pixel layout structure shown in FIG. 1. FIG. 2C illustrates a schematic diagram of a structure of the third metal mask for fabricating the plurality of third sub-pixels 03 of the pixel layout structure shown in FIG. 1.

In the first metal mask, the second metal mask, and the third metal mask respectively shown in FIG. 2A, FIG. 2B, and FIG. 2C, it can be seen that each of the plurality of openings (the first openings 011, the second openings 021, or the third openings 031 are evenly distributed on the metal mask, which can allow the stress of the organic materials to be evenly distributed during the evaporation deposition process of the organic materials, which can result in a reduced difficulty of the process.

According to some embodiments, in order to fabricate the pixel layout structure using the set of the high-resolution metal masks, each of the first metal mask, the second metal mask, or the third metal mask are first assembled with a cover mask, a support mask, and an align mask to thereby form a mask frame assembly (MFA) corresponding to the each of the first metal mask, the second metal mask, or the third metal mask.

The MFA is further disposed in an evaporation deposition chamber to perform an evaporation deposition over a corresponding organic light emitting material to thereby form a pattern for the plurality of corresponding sub-pixels.

In practical implementation, a pattern for the plurality of first sub-pixels, a pattern for the plurality of second sub-pixels, and a pattern for the plurality of third sub-pixels can only be formed once in a time, and thus the pixel layout structure as shown in FIG. 1 can be formed only by sequential formation of the three types of sub-pixels.

Figure 4B:
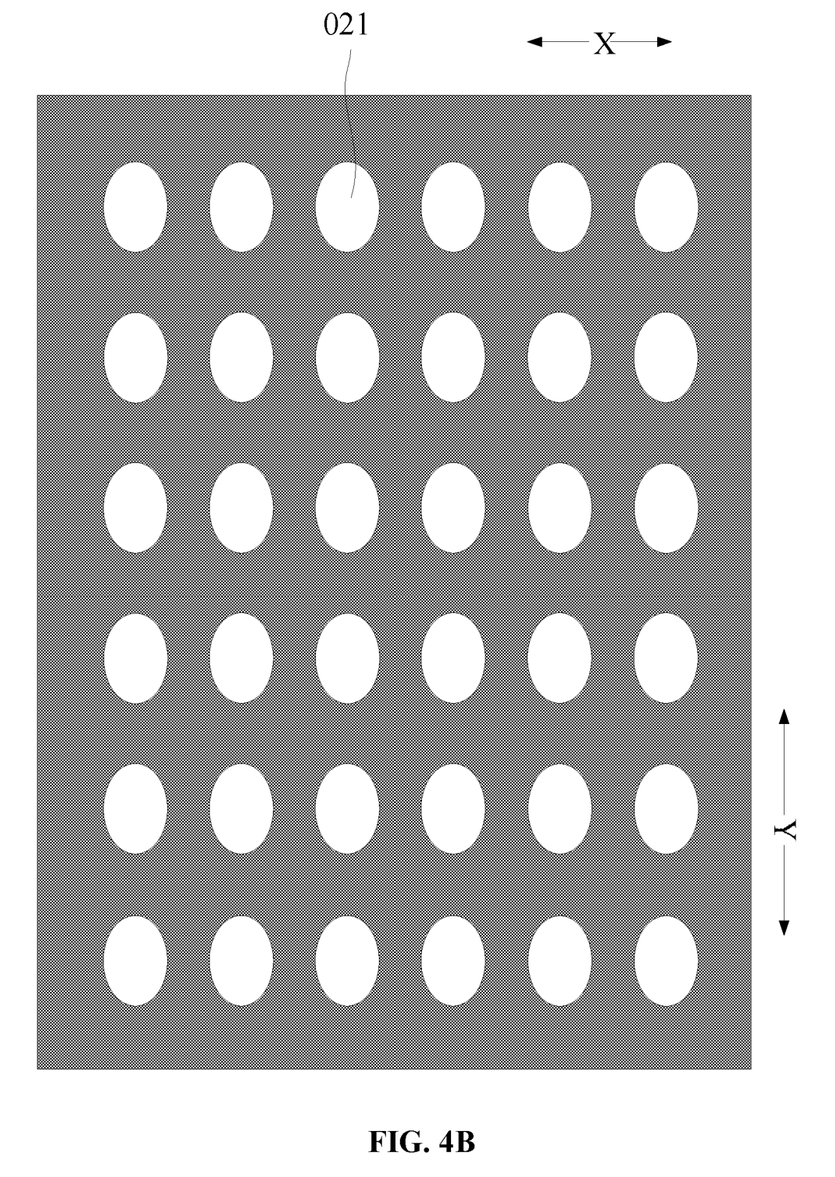
FIG. 4B illustrates a schematic diagram of a structure of the second metal mask for fabricating the plurality of second sub-pixels of the pixel layout structure shown in FIG. 3.
Figure 4C:
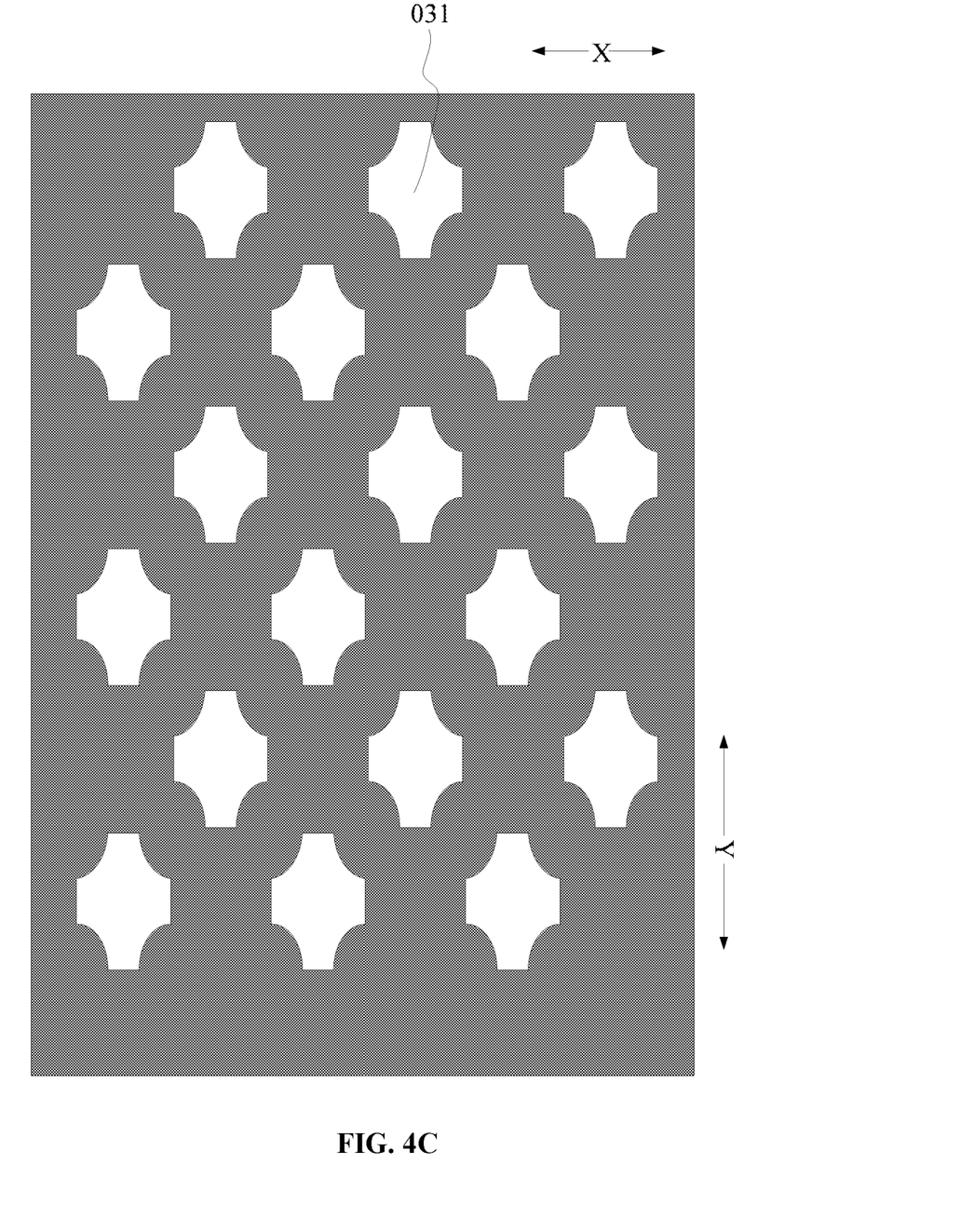
FIG. 4C illustrates a schematic diagram of a structure of the third metal mask for fabricating the plurality of third sub-pixels of the pixel layout structure shown in FIG. 3.

In another embodiment, FIG. 4A illustrates a schematic diagram of a structure of the first metal mask for fabricating the plurality of first sub-pixels 01 of the pixel layout structure shown in FIG. 3. FIG. 4B illustrates a schematic diagram of a structure of the second metal mask for fabricating the plurality of second sub-pixels 02 of the pixel layout structure shown in FIG. 3. FIG. 4C illustrates a schematic diagram of a structure of the third metal mask for fabricating the plurality of third sub-pixels 03 of the pixel layout structure shown in FIG. 3.

The actual design for each of the first metal mask, the second metal mask, and the third metal mask, and their actual implementations for the fabrication of each type of sub-pixels in the pixel layout structure shown in FIG. 3 can reference to the embodiments described above and shown in FIGS. 2A-2C. The detailed descriptions are skipped herein for conciseness.

In a third aspect, the present disclosure further provides a display apparatus, which can have a pixel layout structure according to any one of the embodiments of the disclosure.

Herein, the display apparatus can be, but are not limited to, a mobile phone, a tablet computer, a television, a computer monitor, a notebook computer, a digital camera, a GPS device, or another electronic device having a display functionality.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A pixel layout structure, comprising a plurality of first sub-pixels, a plurality of second sub-pixels, and a plurality of third sub-pixels, arranged as:
    a plurality of first repeat units, each comprising a first sub-pixel and a second sub-pixel; and
    a plurality of second repeat units, each comprising a third sub-pixel and a second sub-pixel;
wherein:
    the plurality of first repeat units and the plurality of second repeat units are alternately arranged along a first direction and a second direction intersecting with the first direction;
    the plurality of second sub-pixels are arranged in a matrix along the first direction and the second direction;
    a set of four corresponding alternative sub-pixels surround a corresponding second sub-pixel, the corresponding alternative sub-pixel including a plurality of corresponding first sub-pixels and a plurality of corresponding third sub-pixels;
    the plurality of first sub-pixels and the plurality of third sub-pixels are alternately arranged in the first direction and the second direction; and
    each of the plurality of alternative sub-pixels comprises a plurality of sides each facing a plurality of corresponding second sub-pixels; and
    a uniform gap distance is formed between a surface of each particular second sub-pixel and each set of four corresponding alternative sub-pixels;
    wherein the corresponding second sub-pixel is a green sub-pixel having an oval shape, and each of the plurality of first sub-pixels and the plurality of third sub-pixels has an irregular octagon shape with each side facing the corresponding second sub-pixel having a concave shape.

2. The pixel layout structure of claim 1, wherein each of the plurality of second sub-pixels has a relatively smaller size than each of the plurality of first sub-pixels, and each of the plurality of second sub-pixels has a relatively smaller size than each of the plurality of third sub-pixels.

3. The pixel layout structure of claim 1, wherein the gap distance between any adjacent sub-pixels has a minimum distance of around 16 μm.

4. A mask set for fabricating a pixel layout structure according to claim 1, comprising at least two masks, wherein each of the at least two masks is provided with a plurality of openings, wherein the at least two masks comprises a first mask and a second mask, the first mask having a plurality of first openings corresponding to the plurality of first sub-pixels or the plurality of third sub-pixels of the pixel layout structure in sizes and positions, and the second mask having a plurality of second openings corresponding to the second sub-pixels of the pixel layout structure in sizes and positions.

5. The mask set according to claim 4, comprising the first mask, the second mask, and a third mask, wherein:
    the first mask is provided with the plurality of first openings, corresponding to the plurality of first sub-pixels in sizes and positions;
    the second mask is provided with the plurality of second openings, corresponding to the plurality of second sub-pixels in sizes and positions; and
    the third mask is provided with a plurality of third openings, corresponding to the plurality of third sub-pixels in sizes and positions.

6. A display apparatus, comprising a pixel layout structure according to claim 1.

7. The display apparatus of claim 6, wherein each of the plurality of first sub-pixels, the plurality of second sub-pixels, and the plurality of third sub-pixels comprises an OLED.

* * * * *